(12) United States Patent
Fusaro, Jr. et al.

(10) Patent No.: US 6,592,948 B1
(45) Date of Patent: Jul. 15, 2003

(54) METHOD FOR MASKING SELECTED REGIONS OF A SUBSTRATE

(75) Inventors: Robert Anthony Fusaro, Jr., Cobleskill, NY (US); Timothy Francis Bethel, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/683,513

(22) Filed: Jan. 11, 2002

(51) Int. Cl.⁷ .............................. C23C 4/02; B05D 1/32
(52) U.S. Cl. .................. 427/448; 427/449; 427/454; 427/456; 427/248.1; 427/250; 427/255.7; 427/282; 427/272; 427/287; 427/290; 427/292; 204/192.1; 204/192.15
(58) Field of Search ................. 427/448, 454, 427/456, 282, 287, 272, 449, 250, 255.7, 248.1, 290, 292; 118/302, 505; 204/192.1, 192.15

(56) References Cited

U.S. PATENT DOCUMENTS 4,666,743 A * 5/1987 Ohta et al. .................. 427/448
5,508,097 A * 4/1996 Hauser et al. ................. 442/67

OTHER PUBLICATIONS

Product information sheet—#834 Hi–Temp Glass Cloth Tape, Acutape Corporation, 25 Perry Ave., Norwalt, CT 06850 USA. (No date).

Product information sheet—Berkstop MS Metal Spray Masking Paint, IP Code No. PL220. (No date).

* cited by examiner

Primary Examiner—Katherine A. Bareford
(74) Attorney, Agent, or Firm—Toan P. Vo; Noreen C. Johnson

(57) ABSTRACT

Described herein is a method for providing a clean edge at the interface of a portion of a substrate coated with a coating system and an adjacent portion of the substrate which is uncoated. The method includes the step of forming a zone of non-adherence on the substrate portion which is to be uncoated, prior to application of the coating system. The zone of non-adherence is adjacent the interface, so that the coating system will not adhere to the zone of non-adherence, but will adhere to the portion of the substrate which is to be coated with the coating system.

22 Claims, 6 Drawing Sheets

METHOD FOR MASKING SELECTED REGIONS OF A SUBSTRATE

BACKGROUND OF THE INVENTION

The present invention is generally directed to methods for providing coatings on selected portions of a substrate. In more particular embodiments, the invention relates to masking techniques used in the application of protective coatings to metallic substrates employed in high temperature applications.

Metal alloys are often used in industrial environments which include extreme operating conditions. For example, the alloys may be exposed to high temperatures, e.g., above about 750C. Moreover, the alloys may be subjected to repeated temperature cycling, e.g., exposure to high temperatures, followed by cooling to room temperature, and then followed by rapid re-heating. As an example, gas turbine engines are often subjected to repeated thermal cycling during operation.

The turbine engine components (and other industrial parts) are often formed of superalloys, which are usually nickel-, cobalt-, or iron-based. Superalloys can withstand a variety of extreme operating conditions. However, they often must be covered with coatings which protect them from environmental degradation, e.g., the adverse effects of corrosion and oxidation.

Various types of coatings are used to protect superalloys and other types of high-performance metals. As one example, a thermal barrier coating (TBC) system is often employed. The TBC system includes a bond layer (usually an MCrAlX material, as described below) and a ceramic overcoat, such as a zirconia-based material. The bond layer promotes adhesion between the substrate and the ceramic overcoat. Many techniques are available to apply the TBC systems. Examples include vacuum plasma deposition (VPS) and air plasma spray (APS).

It is usually very important that protective coatings like the TBC's are deposited on very specific areas of a substrate. As an example, various sections of a turbine engine nozzle need to be completely covered with a highly adherent TBC system, since these sections are exposed to high-temperature combustion gasses. However, in many instances, adjacent sections of the nozzle must be completely free of the protective coatings. For example, some of the "slash faces" of a nozzle may have to be eventually welded. Therefore, they must not contain any coating material which would interfere with the welding process. A "clean",distinct edge between a coated and an uncoated section of a substrate is often critical to the overall coating process.

To provide one specific example, FIG. 1 is a perspective of a portion of a typical turbine airfoil 10, which includes superalloy substrate 12. In some instances, it is necessary to apply a high-quality TBC system on the surface of substrate 12, as well as on platform 14 and vertical face 16. However, it may also be necessary to keep surface 18 entirely free of TBC or bond coat material. In other words, corner-edge 20 must sometimes be, ultimately, very clean. Top platform 22 is depicted in simplified form, and would also usually include various surfaces which are to be coated, along with adjacent surfaces which are to remain uncoated.

Various techniques are available for ensuring that a clean edge is formed between a coated and uncoated section of a substrate. Usually, the surfaces which are to remain uncoated are taped off prior to the coating deposition step. Often, masks are also used, alone or in conjunction with tape, to prevent deposition of a coating onto an area covered by the pattern of the mask. Mask or tape may also be used to protect sections of the substrate from various pre-treatment steps. As an example, a grit-blasting step is often necessary to roughen a surface prior to the thermal spray-deposition of a coating. It is usually necessary to tape off other sections which are not to be coated, since grit blasting can damage those sections. After the desired coating is deposited, the mask and tape can be removed. Additional coating steps or other treatment steps can then be carried out, which may involve additional masking and taping steps.

While masking techniques are effective in many coating processes, they sometimes exhibit serious drawbacks. "Hard" metal masks have typically been used in the past. They are usually very thick (at least about 0.125 inch (3.2 mm)), and made of high temperature materials like nickel-based superalloys. It is often time-consuming to position these hard masks on specific sections of the substrate. Moreover, the hard masks are not pliable, and do not easily conform to sections of the substrate which are curved or contain many indentations. Since that conformance is often necessary, hard masks may have to be pre-shaped in separate metalworking procedures, which can be costly and time-consuming.

Furthermore, the "clean edge" discussed above is often not possible when a hard mask is used. Such a mask is usually positioned at the boundary between a substrate section to be coated and another section which is to be left uncoated. As coating material is deposited, a hump or ridge of material is built up at the edge adjacent the uncoated section. (This occurrence is often referred to as "bridging"). When the mask is removed, chipping and cracking often occurs along the edge. This problem can be especially severe in the case of ceramic overcoats (e.g., zirconia-based coatings), which have high cohesive strength in a direction horizontal to the plane of the substrate. The force needed to remove the hard mask can cause a significant amount of the desired coating to be pulled off the coated section of the substrate.

In the case of turbine engine components, the loss of any coating material can be a very serious problem, since the edge of the underlying part is then directly exposed to very high in-service temperatures. Moreover, chipping and cracking along the edge can serve as crack propagation sites for further degradation throughout the coating. Thus, time-consuming steps have to be undertaken to repair the coating imperfections. More often, the parts must be entirely stripped and re-coated. These steps add considerable expense to the overall manufacturing process.

Other masking procedures can be used in place of the hard masks. For example, chemical masking techniques are sometimes used, in which a non-bonding coating (e.g., an "anti-bond" material) is sprayed or painted on selected portions of the substrate. These types of non-bonding materials prevent the protective coatings from permanently adhering to the substrate.

While chemical masking techniques are effective in some applications, they often include drawbacks as well. For example, it often takes about 8–16 hours for the chemical mask to dry, prior to protective coating deposition. Moreover, additional steps are needed to remove the chemical mask after coating deposition is complete. A variety of solvents and additive-based solutions may have to be used to completely remove the chemical mask, since any chemical residue may interfere with subsequent coating, treatment, or welding operations.

It should thus be apparent that new masking processes would be very welcome in the field of protective coating technology. Use of the processes should result in a very clean edge or boundary between coated and uncoated sections of a substrate. The processes should be capable of being carried out in an efficient manner, without causing delays in any other steps undertaken in processing the substrate. Moreover, the processes should be compatible with techniques used to apply protective ceramic and metallic coatings to superalloy substrates—including those which may be curved and/or which may contain various cavities or indentations.

SUMMARY OF INVENTION

The needs described above have been satisfied by the discovery of a new method for providing a clean edge at the interface of a portion of a substrate coated with a coating system and an adjacent portion of the substrate which is uncoated. The coating system comprises at least two coatings. The method includes the step of forming a zone of non-adherence (as described below) on the substrate portion which is to be uncoated, prior to application of the coating system. The zone of non-adherence is adjacent the interface, so that the coating system will not adhere to the zone of non-adherence, but will adhere to the adjacent portion of the substrate which is to be coated with the coating system.

When the substrate is a high-temperature article such as a turbine engine component, the first coating is usually a bond coat, e.g., an MCrAl(X)-type material, as described below. In that instance, the second coating is usually a thermal barrier coating, such as stabilized zirconia.

A more specific embodiment of the invention is directed to a new technique for masking the surface of the substrate while applying the coatings thereto. The technique includes the following steps:

a) applying a protective tape to a first portion of the surface which is to remain non-roughened;

b) roughening a second portion of the surface adjacent the first portion;

c) removing the protective tape from the first portion of the surface;

d) covering a primary section of the first portion of the surface with a protective sheet, while leaving a fracture zone uncovered, said fracture zone being situated adjacent the second portion of the surface;

e) covering the fracture zone and at least a portion of the protective sheet adjacent the fracture zone with a durable tape;

f) applying a first coating over the substrate surface, so that it adheres to the roughened, second portion of the surface;

g) removing the durable tape to uncover the fracture zone and the portion of the protective sheet;

h) applying a second coating over the surface of the substrate, covering and adhering to the first coating, but not substantially adhering to the fracture zone; and i) removing the protective sheet.

After removal of the protective sheet, residual coating material usually remains at the interface of the area to be coated and the area to be left uncoated. This residue lies over the fracture zone, and can be very easily removed, as described below. A very clean edge remains, and the coating system applied in the desired area is substantially, free of cracks and other defects which were often caused by prior art-masking techniques.

Further details regarding the various features of this invention are found in the remainder of the specification.

DETAILED DESCRIPTION

Masking procedures are necessary when applying coatings to selected areas on the surface of a variety of substrates. Very often, the substrate is a metallic material. As used herein, "metallic" refers to substrates which are primarily formed of metal or metal alloys, but which may also include some non-metallic components. Non-limiting examples of metallic materials are those which comprise at least one element selected from the group consisting of iron, cobalt, nickel, aluminum, chromium, titanium, and mixtures which include any of the foregoing (e.g., stainless steel). The substrate may include curves. Moreover, its surface can include various features, such as indentations, cavities, and raised features.

In the case of turbine engines, the metallic material is usually a superalloy. Such materials are known for high-temperature performance, in terms of tensile strength, creep resistance, oxidation resistance, and corrosion resistance, for example. The superalloy is typically nickel-, cobalt-, or iron-based, although nickel- and cobalt-based alloys are favored for high-performance applications. The base element, typically nickel or cobalt, is the single greatest element in the superalloy by weight. Illustrative nickel-base superalloys include at least about 40 wt % Ni, and at least one component from the group consisting of cobalt, chromium, aluminum, tungsten, molybdenum, titanium, and iron. Examples of nickel-base superalloys are designated by the trade names Inconel®, Nimonic®, Rene® (e.g., Rene® 80-, Rene® 95, Rene® 142, and Rene® N5 alloys), and Udimet®. Illustrative cobalt-base superalloys include at least about 30 wt % Co, and at least one component from the group consisting of nickel, chromium, aluminum, tungsten, molybdenum, titanium, and iron. Examples of cobalt-base superalloys are designated by the trade names Haynes®, Nozzaloy®, Stellite® and Ultimet®.

Figure 1:
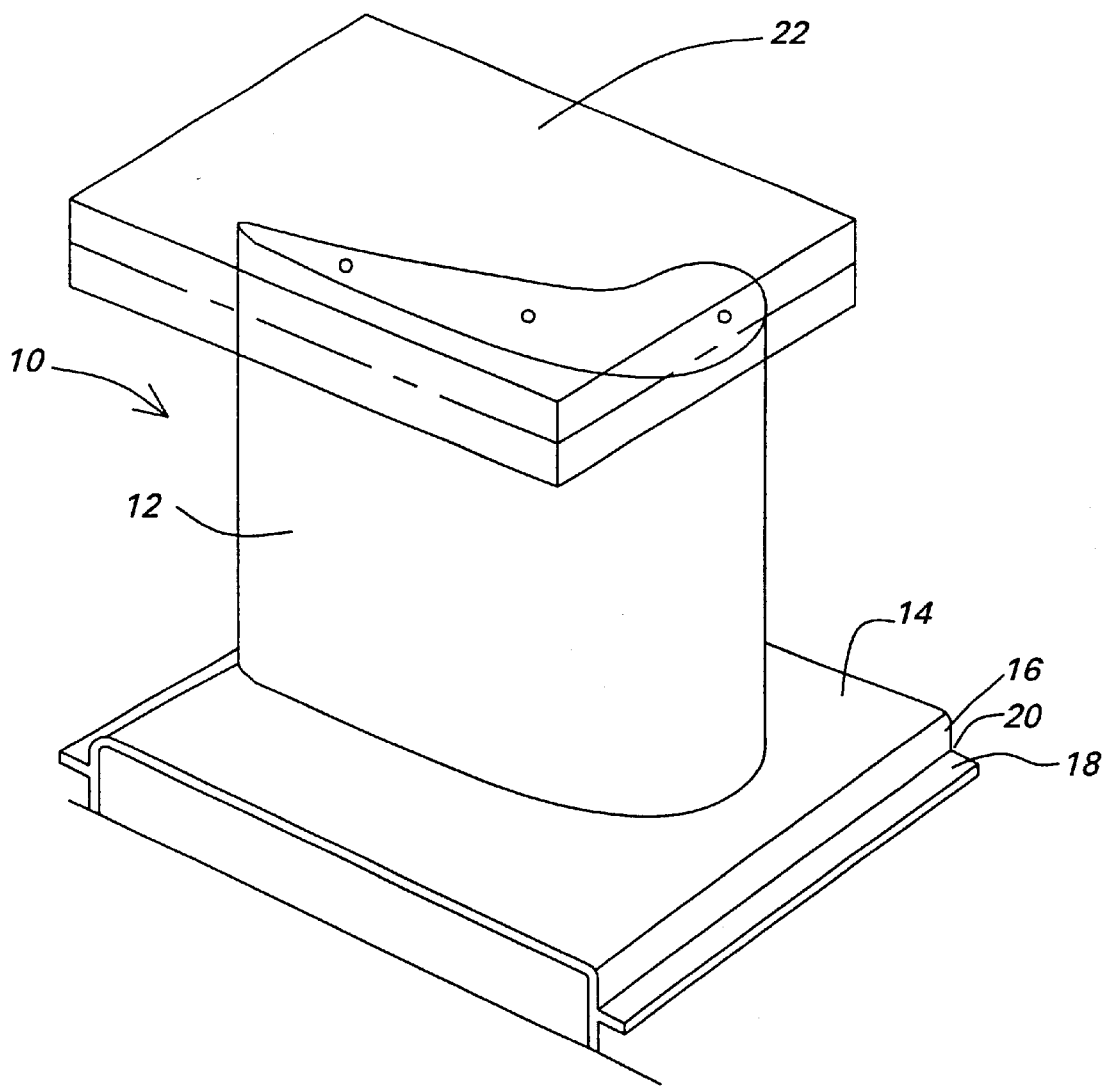
FIG. 1 is a perspective view of a turbine engine airfoil.
Figure 2:
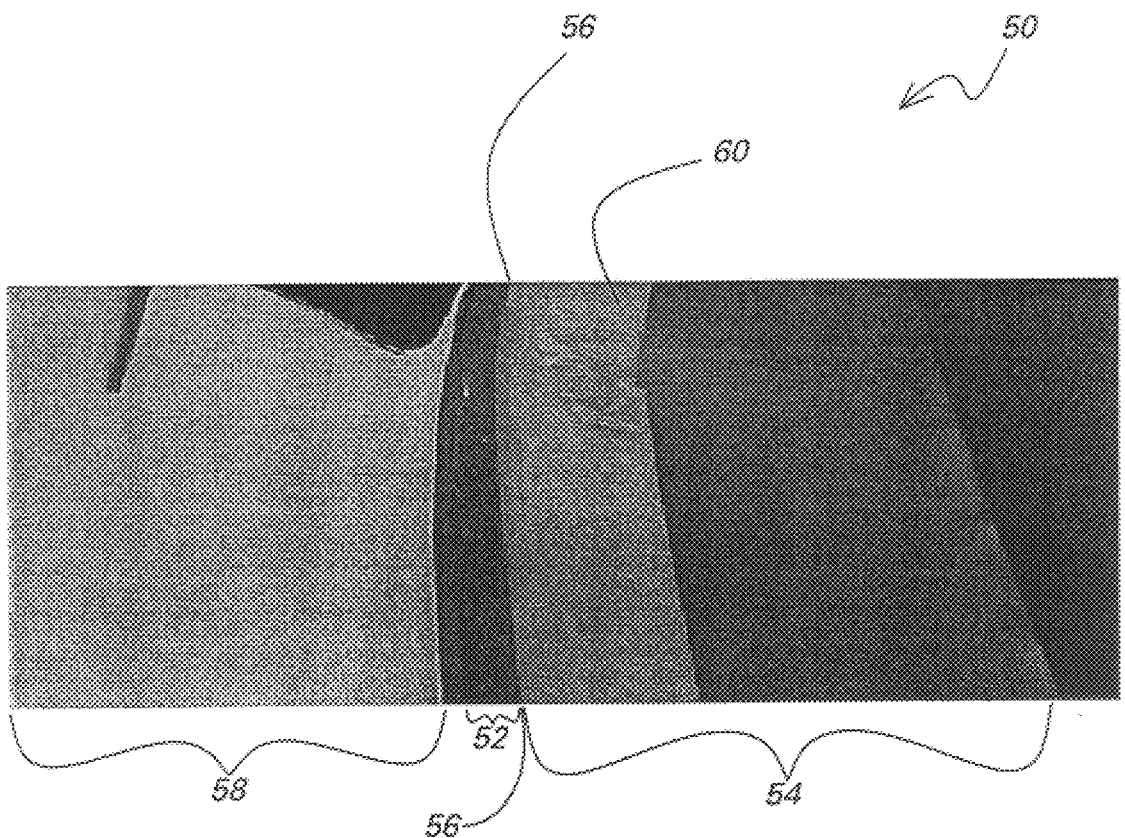
FIG. 2 is a photograph of a section of a substrate being masked according to this invention.

FIG. 2 is a photograph of portion 50 of a substrate surface of a metallic article. A highly-adherent protective coating is to be applied to coating surface 52 of the article. Section 54 of the same surface is to remain uncoated. (Section 54 is sometimes referred to herein as the "first portion" or the "uncoated" section) (In FIG. 2, section 54 is covered by tape, as discussed below). It is very important that, at the conclusion of the coating process, the interface 56 between sections 52 and 54 be very "clean". In other words, the protective coating should completely cover section 52, without any chipping or cracks, but should be substantially free from any adjacent portion of section 54. Section 58 is a section of the substrate which slopes in a substantially-vertical direction down to a platform, e.g., one similar to platform 14 of FIG. 1. It is also usually covered by coatings.

In one embodiment, a protective tape 60 is first applied over section 54. The purpose of the tape is to protect section 54 from the effects of an adhesion-promoting treatment, which is to be used on section 52. Various types of tape may be used, depending on the type of substrate and adhesion-promoting technique being employed. Conventional electroplating tape is usually very suitable.

An example of an adhesion-promoting treatment is surface-roughening. The term "roughening" is used herein for the purpose of simplicity. However, it should also be construed to represent any other, conventional adhesion-promoting technique.

Figure 3:
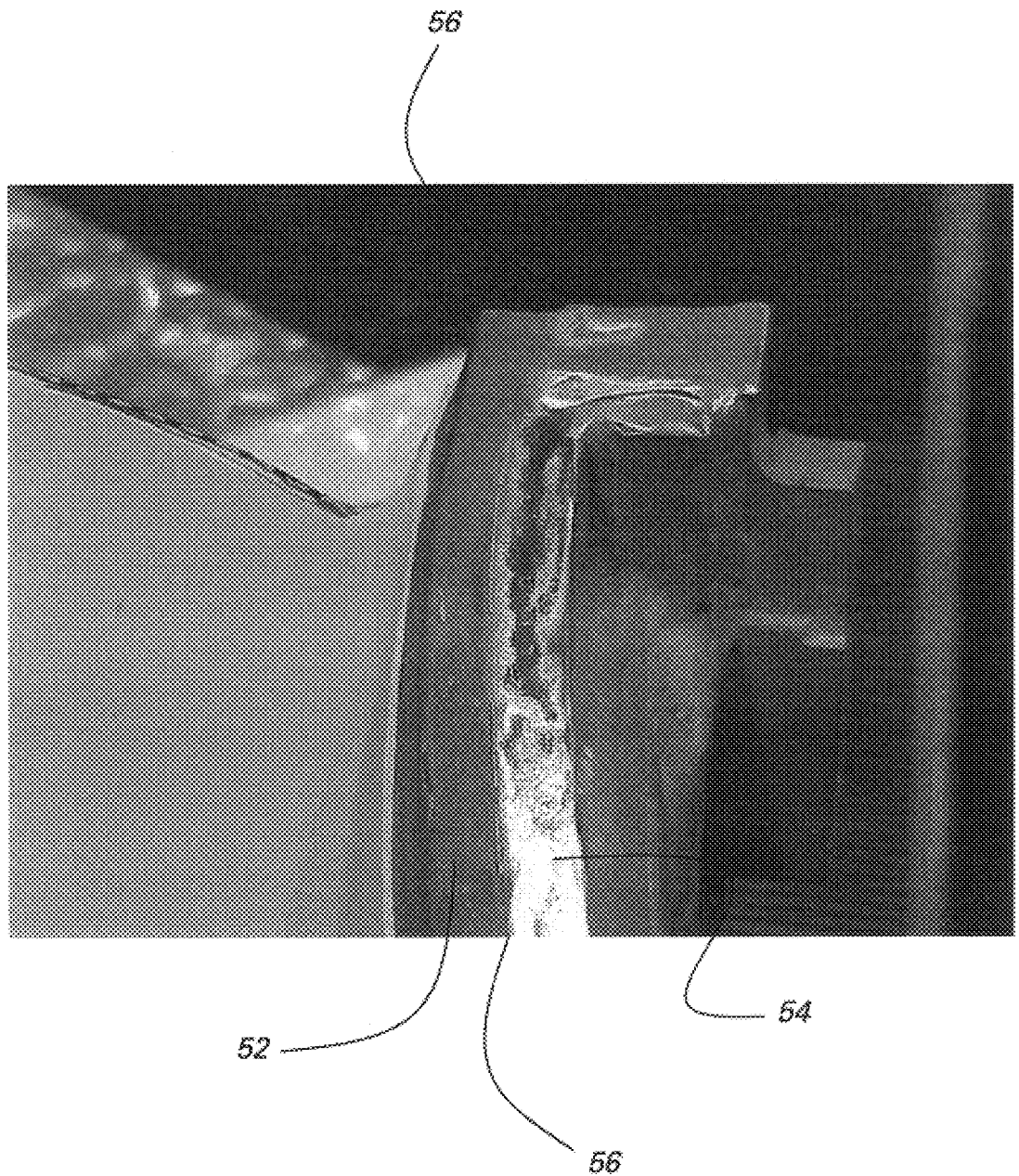
FIG. 3 is another photograph of the substrate of FIG. 2, after a section of the substrate has been roughened.

Section 52 (sometimes referred to herein as the "second portion") is then roughened in a conventional manner. Various techniques are available, depending on the type of substrate and the required degree of roughness. Non-limiting examples include scoring; chemical- or mechanically etching; and grit-blasting. Grit-blasting is often preferred when the overlying coating is a metallic bond coat, as discussed below. In such a case, the roughening treatment is usually carried out to provide a surface with a roughness value "Ra" (root mean square roughness) of at least about 175 micro-inches. The specific degree of roughness will depend on various factors, such as coating composition, coating deposition techniques, and end use applications. When the bond coat is to be plasma sprayed (e.g., by APS), the desired Ra value is usually greater than about 600 micro-inches. (Such a surface is very desirable for increasing the adhesion of a subsequently-applied thermal barrier coating.) After the roughening step is completed, the protective tape 60 is removed. Non-roughened-surface 54 is thus revealed, as shown in FIG. 3. The interface 56 of surface 54 with coating surface 52 is also shown in the figure.

Figure 4:
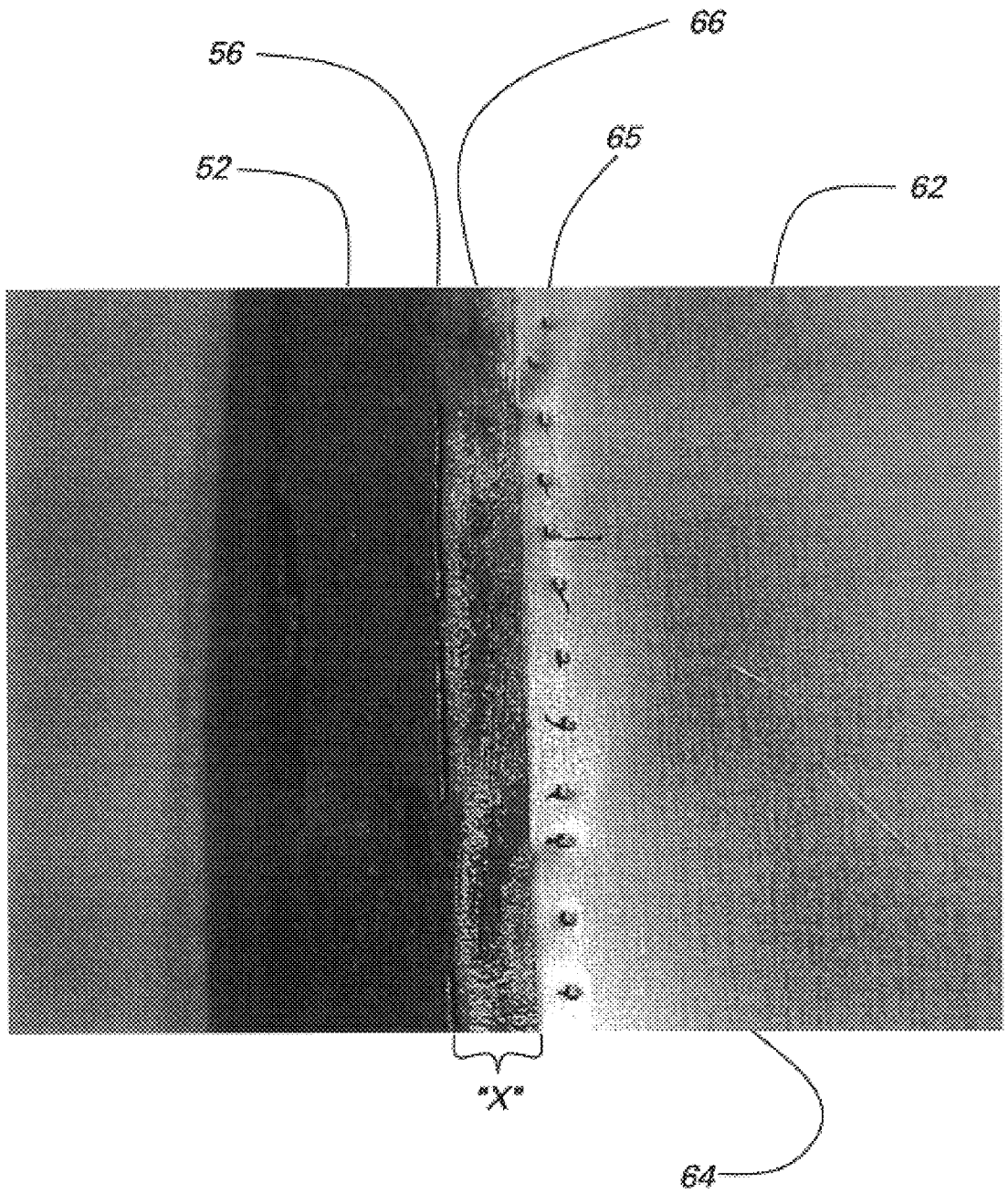
FIG. 4 is another photograph of the substrate of FIG. 3, after placement of a protective sheet on a section of the substrate.

A covering or protective sheet 62 is then placed over a primary section 64 of the uncoated section 54, as shown in FIG. 4. The sheet is spaced from coating surface 52, so as to leave a non-roughened surface section 66. This section is referred to herein as a "fracture zone" or "zone of non-adherence", as further explained below. The composition of sheet 62 will depend on various factors, such as the shape and contour of the substrate; the desired flexibility and thickness of the sheet; the manner by which it is to be attached to the substrate; and the type of deposition techniques used to apply coatings over the substrate. As those skilled in the art understand, different deposition methods include different features. For example, in the case of plasma spray processes, some of the factors which may relate to choosing a composition for sheet 62 are substrate temperature, spray temperature, gun-to-substrate distance, and gun speed. The sheet can be formed of various materials, such as heavy-duty fabrics made from high-temperature fibers, e.g., resin-impregnated glass fibers, silicon carbide fibers, aramid fibers, and the like.

When the subsequent coating processes (e.g., plasma spray) involve temperatures greater than about 300C., sheet 62 is usually a metal foil. Non-limiting examples of foil materials include steel, stainless steel, iron, and tin. Various alloys of any of these materials are also possible. Stainless steel and alloys thereof are often the most preferred materials in the case of high-temperature coating techniques. (Metals like stainless steel are often provided in annealed grades, which are softer and/or more flexible).

Sheet 62 must have a thickness which allows it to withstand coating deposition conditions. When the sheet is a metallic foil, it must be thick enough to resist warping, melting, or other degradation during the subsequent coating steps. For example, if one or more nickel/chrome-type coatings are to eventually be applied by a plasma spray process such as APS, the foil must be able to withstand temperatures greater than about 600–1000C. Moreover, the foil must usually be thin enough to be flexible and "shapeable". This requirement is very important when the underlying substrate is contoured, and/or contains various indentations or cavities.

The maximum thickness of the foil is usually no greater than about 0.5 mm (19.7 mils), and preferably, no greater than about 0.25 mm (9.9 mils). The minimum thickness is usually at least about 0.025 mm (1 mil), and preferably, greater than about 0.05 mm (2 mils). As mentioned above, though, the foil thickness may vary according to various factors, e.g., deposition parameters, foil material, and the like.

The width of fracture zone 66 (i.e., dimension "X" in FIG. 4) will depend on various factors. A primary factor is the thickness of the coatings which are to be eventually applied—especially the "second coating", as described below. Those coatings will not substantially adhere to the non-roughened fracture zone, and can easily be edged away from coating surface 52, as also described below. In the case of a second coating which has a thickness (after any polishing step) of about 1 mil (25 microns) to about 60 mils (1.5 mm), the fracture zone will usually have a width between about 0.08 inch (2 mm) and about 0.2 inch (5 mm). The selected width of the fracture zone can be varied according to empirical observation. For example, one can observe (for a given width) whether cracking occurs in the applied coatings after the protective mask is removed, as described below. Moreover, the shape of the fracture zone can vary somewhat, depending on coating requirements, for example.

Sheet 62 can be attached to primary section 64 of the substrate by various techniques. Selection of a particular technique will depend on a number of factors, such as the composition of the sheet, and the type of deposition processes which are to be used for the coatings. Fiber or fiber/glass-based sheets can be bonded to the substrate with appropriate adhesives. Sheets made from metal foils can often be welded to the substrate. Alternatively, they can be attached to the substrate by mechanical methods, e.g., by using clamps, bolts, or rivets.

In some preferred embodiments, iron- or steel-based foils are welded to the substrate by a variety of techniques, such as resistance welding, e.g., spot welding. (Other types of welding might be employed, but care must be taken to avoid crack-initiation). When high-temperature coating techniques such as plasma spray are to be used, it is important that the welding sites (e.g., weld "spots" 65 in FIG. 4) be spaced closely enough to prevent warping or detachment of the foil during deposition. However, they should not be spaced so closely that removal of the resulting, large number of weld sites is labor-intensive. Usually, the welding sites are spaced about 0.05 inch (1.3 mm) to about 0.15 inch (3.8 mm) from each other. In the case of mechanical attachments, similar techniques may have to be carried out to ensure that the foil is fastened very securely to the substrate.

Figure 5:
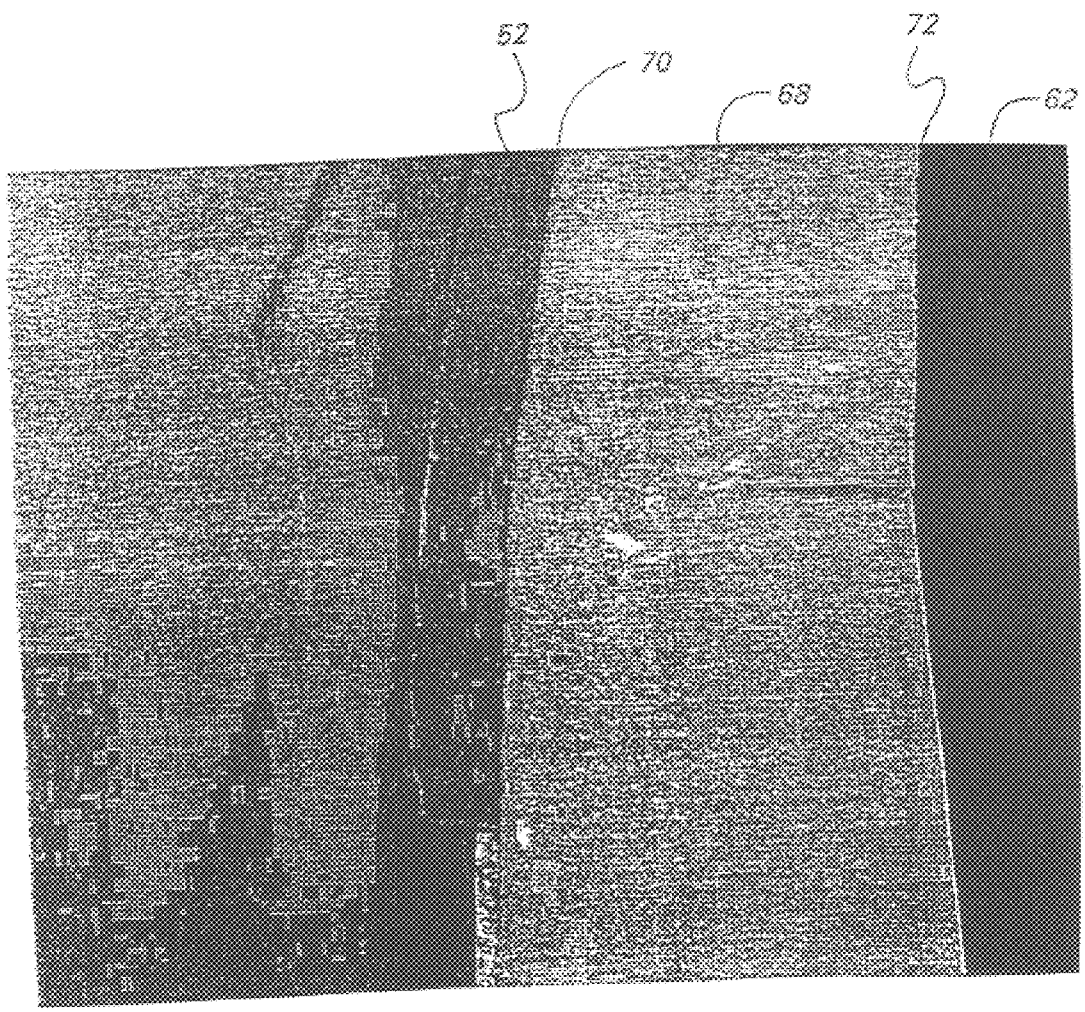
FIG. 5 is a photograph of the substrate of FIG. 4, following the placement of a durable tape over a selected section of the substrate.

Fracture zone 66 and at least a portion of sheet 62 are then covered with a durable tape 68, as shown in FIG. 5. The function of the durable tape is to protect the underlying substrate during the deposition of the first coating. The tape itself is "durable" enough (i.e., no melting or tearing) to withstand the effects of such deposition, without adversely affecting the substrate. The first edge 70 of tape 68 which is closest to coating surface 52 (i.e., the roughened surface) is generally aligned over interface 56 (FIG. 3). In other words, coating surface 52 remains uncovered, in preparation for subsequent coating deposition. The location of the second edge 72 of tape 68, which is farthest from coating surface 52, will of course depend on the desired width of the tape. Usually, the tape is wide enough to cover the portion of underlying sheet 62 which should remain uncoated with the first coating.

The composition of durable tape 68 will depend in part on the deposition method used to apply the first coating. When plasma deposition is being employed, the tape is often formed of aluminum, resin/glass fabric blends, polytetrafluoroethylene, or some combination of these materials. As an example, suitable aluminum foil-glass cloth tapes are available from Furon Corporation.

Moreover, the durable tape is thick enough to sufficiently protect the substrate during coating deposition. However, it is thin enough to prevent the subsequently-applied first coating from curling up, off the tape, after deposition. For a bond coat having a thickness of about 4 to 16 mils (about 100 to about 400 microns), the durable tape typically has a thickness in the same range. The tape could be applied in multiple layers (with a total thickness within the ranges set forth above), but is preferably applied as a single layer. Usually, the tape is pressed down on the surface, e.g., with a blunt tool, to ensure good adhesion.

After durable tape 68 is in place, the first coating is applied over the substrate surface. The type of coating used will of course depend on the substrate and the environment in which it will be employed. As described previously, the first coating is usually a bond coat ("bond layer"). Bond coats for thermal barrier coating systems often have the composition MCrAl(X). In that formula, M is an element selected from the group consisting of Ni, Co, Fe, and combinations thereof; and X is an element selected from the group consisting of Y, Ta, Si, Hf, Ti, Zr, B, C, and combinations thereof. These materials are well-known in the art. The bond coat can also be an aluminide alloy.

The first coating can be applied by a variety of processes, many of which are referred to broadly as "thermal spray" or "plasma spray" techniques. Non-limiting examples of suitable techniques include sputtering, physical vapor deposition (PVD), vacuum plasma spray (VPS), high velocity oxy-fuel (HVOF), air plasma spray (APS), wire spray, and arc-wire spray. All of these techniques are well-known in the art. Care should be taken with deposition techniques which involve very high temperatures, such as HVOF. In such an instance, low-pressure hardware and higher gun speeds may be used.

The first coating covers coating surface 52 of FIG. 5. When the first coating is a plasma-sprayed bond coat (e.g., an MCrAl(X) coating), it adheres very tightly to surface 52. The thickness of the first coating (after curing) will depend in large part on its purpose, and is usually in the range of about 4 mils to about 16 mils (about 100 to about 400 microns), as mentioned above. In some preferred embodiments, the thickness is in the range of about 200 microns to about 300 microns.

After the first coating has been applied, durable tape 68 is removed, uncovering fracture zone 66 (FIG. 4) and the metal foil. While no special technique is required to remove the tape, it is preferably lifted off by pulling in a direction away from coating surface 52. For example, the tape can be gradually pulled away from edge 70 toward edge 72 in FIG. 5. Removal of the tape in this manner helps to ensure that none of the first coating is inadvertently removed from surface 52. Any residual coating material (e.g., "curls") at or near edge 68 can then be removed by any convenient technique, e.g., with a knife or other edging tool. None of the first coating overlies fracture zone 66.

A second coating is then applied over the surface of the substrate. The material for the second coating will depend on the intended end use for the article, and the type of first coating applied. In the case of a turbine engine article, the second coating is usually a ceramic overcoat. For example, the overcoat can be a TBC, as described previously. Very often, the TBC is zirconia-based. As used herein, "zirconia-based" embraces ceramic materials which contain at least about 70% zirconia, by weight. In preferred embodiments, the zirconia is chemically stabilized by being blended with a material such as yttrium oxide, calcium oxide, magnesium oxide, cerium oxide, scandium oxide, or mixtures of any of those materials. In one specific example, zirconia can be blended with about 1% by weight to about 20% by weight yttrium oxide (based on their combined weight), and preferably, from about 3%–10% yttrium oxide.

Many of the techniques described above can be used to apply the second coating, depending on various considerations, such as the coating's purpose; its composition; and the technique used to apply the first coating. When the second coating is a TBC, it is often applied by a plasma spray process such as APS. The TBC can also be applied by sputtering, physical vapor deposition (PVD), or vacuum plasma spray (VPS). The second coating usually has a thickness in the range of about 125 microns (4.9 mils) to about 2500 microns (98.4 mils).

The second coating is applied to cover and adhere to the first coating. However, it does not substantially adhere to the non-roughened fracture zone 66 of FIG. 4, as described earlier. In other words, adhesion substantially ends at interface 56.

Sheet 62 (e.g., the foil) is then removed from the substrate. Any suitable removal technique can be employed, depending on the type of sheet, and how it was attached to the substrate. As in the case of the durable tape, it is preferable to remove sheet 62 by pulling in a direction away from coating surface 52 (FIG. 5). Removal of the sheet in this manner helps to ensure that none of the second coating is inadvertently removed from surface 52.

Figure 6:
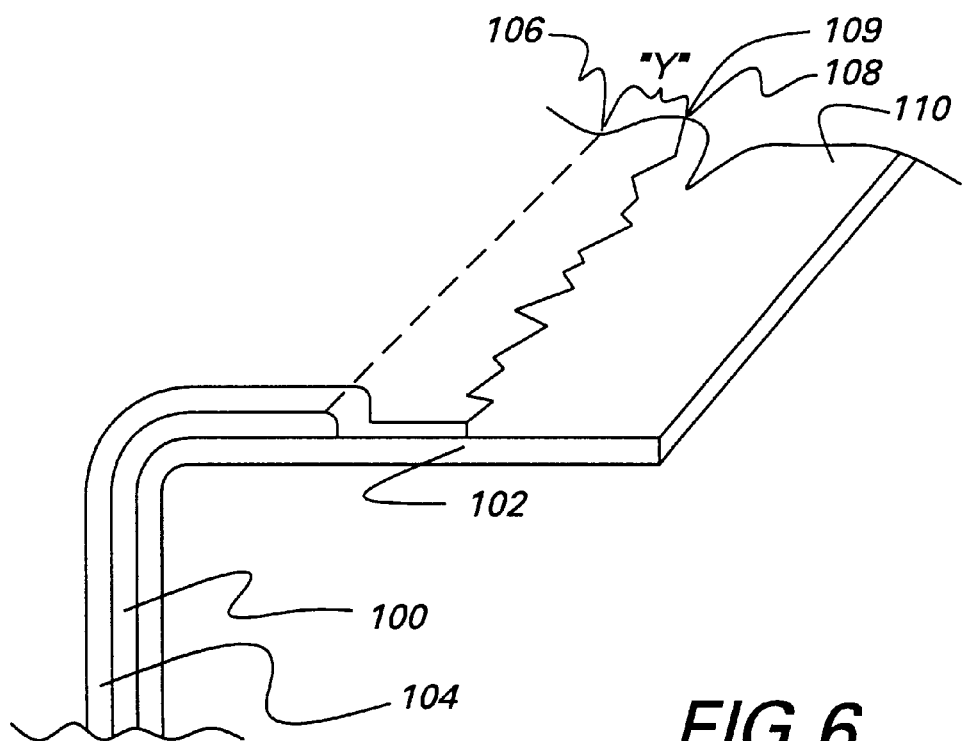
FIG. 6 is a depiction of a section of a substrate, after deposition of first and second coatings, according to the present invention.

FIG. 6 is a depiction of an article masked and coated by the process described above, after the sheet (e.g., the metal foil) has been removed. First coating 100 had been applied over a selected surface of substrate 102. Second coating 104 had then been applied over coating 100, after removal of the durable tape (not shown), as described previously. An imaginary line of dashes is used to depict the underlying, first coating edge 106. The unfinished edge 108 of second coating 104 extends over the first coating onto the surface 110 of substrate 102.

The region "Y" of second coating material 104 in FIG. 6 lies between first and second coating edges 106, 108. This region is generally on top of fracture zone 109. Therefore, the second coating in region Y has substantially no adhesion to the. underlying substrate. It can be removed very easily, by a number of techniques. For example, conventional cutting or grinding tools can be used. (Heavy grinding is usually not necessary, as the coating tends to fall or flake off easily, or can be chipped off easily). Deburring wheels or polishing wheels are often used, as well as abrasive products like "Scotch-Brite ™". For example, a rotary brush formed of Scotch-Brite strips could be moved across region Y to remove most of the coating residue, followed by light polishing and/or the use of air blasts to complete the cleaning.

Figure 7:
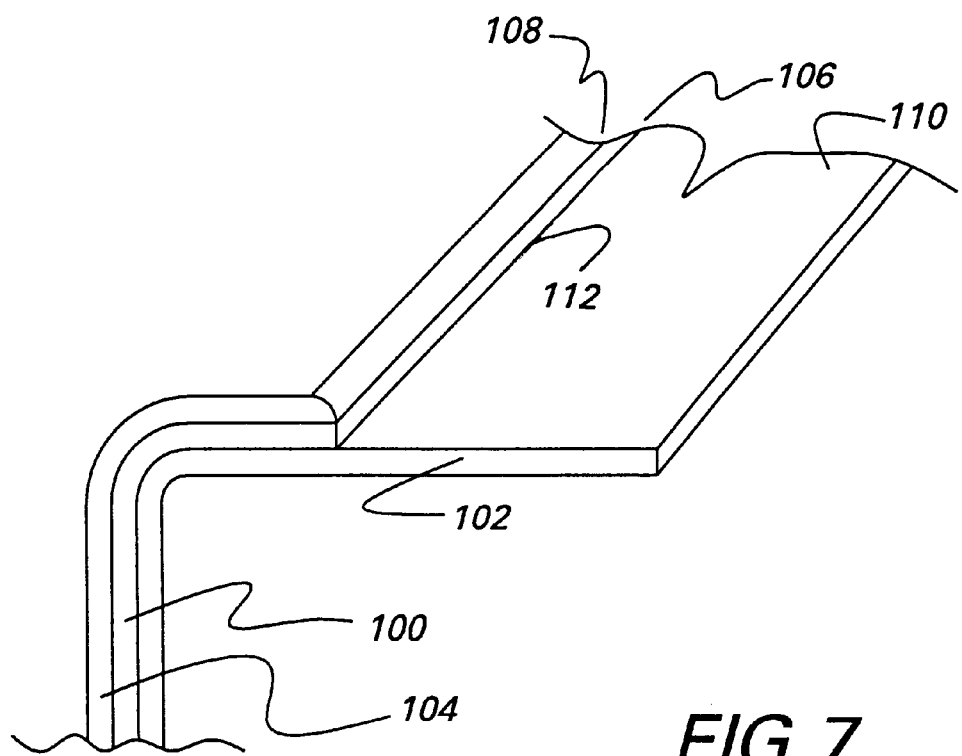
FIG. 7 is a depiction of the substrate section of FIG. 6, after finishing of the coating edges according to this invention.

FIG. 7 is a depiction of the coated substrate of FIG. 6, after "edge-finishing". First coating edge 106 and second coating edge 108 are both clean, and substrate 110 is free of any coating material. Moreover, there is a high degree of adhesion between the two coatings, and between the first coating and the substrate.

Different ways of finishing each coating edge are possible, in terms of shape and appearance. The edges are tapered and beveled in FIG. 7, by way of conventional, light grinding techniques. In such an embodiment, a minor edge face 112 remains exposed, which is acceptable in many situations.

However, an alternative embodiment is sometimes desirable when the coating system is to be exposed to high temperatures (e.g., above about 750C.). In such an instance, the second coating can be "wrapped around" the exposed edge of the first coating, adhering tightly thereto. Any residual second coating material that extends onto substrate surface 110 can be easily removed by one of the techniques described previously.

Regardless of the finishing style, the first coating is completely covered by the second coating. This is especially important when the two coatings constitute a TBC system, e.g., one used to protect a turbine engine component.

Having described preferred embodiments of the present invention, alternative embodiments may become apparent to those skilled in the art, without departing from the spirit of this invention. Accordingly, it is understood that the scope of this invention is to be limited only by the appended claims.

What is claimed is:

1. A method for masking the surface of a substrate while applying two or more coatings to the surface, comprising the following steps:

a) applying a protective tape to a first portion of the surface which is to remain non-roughened;
   b) roughening a second portion of the surface adjacent the first portion;
   c) removing the protective tape from the first portion of the surface;
   d) covering a primary section of the first portion of the surface with a protective sheet, while leaving a fracture zone uncovered, said fracture zone being situated adjacent the second portion of the surface;
   e) covering the fracture zone and at least a portion of the protective sheet adjacent the fracture zone with a durable tape;
   f) applying a first coating over the substrate surface, so that it adheres to the roughened, second portion of the surface;
   g) removing the durable tape to uncover the fracture zone and the portion of the protective sheet;
   h) applying a second coating over the surface of the substrate, covering and adhering to the first coating, but not substantially adhering to the fracture zone; and
   i) removing the protective sheet.

2. The method of claim 1, wherein the substrate is a superalloy material.

3. The method of claim 1, wherein the roughening of the second portion of the surface is carried out by grit-blasting.

4. The method of claim 1, wherein the protective sheet is a metal foil.

5. The method of claim 4, wherein the metal foil is pliable.

6. The method of claim 4, wherein the metal foil comprises a material selected from the group consisting of steel, stainless steel, iron, tin, and alloys which include any of the foregoing.

7. The method of claim 4, wherein the metal foil has a thickness no greater than about 0.5 mm.

8. The method of claim 7, wherein the metal foil has a thickness in the range of about 0.025 mm to about 0.5 mm.

9. The method of claim 1, wherein the protective sheet is attached to the first portion of the surface, in a manner which prevents the sheet from warping or being detached during the deposition of the first and second coatings on the substrate surface.

10. The method of claim 9, wherein the protective sheet is a metal foil, which is spot-welded to the first portion of the surface.

11. The method of claim 1, wherein the fracture zone includes a width generally perpendicular to the boundary between the first surface portion and the second surface portion, and said width is in the range of about 2 mm to about 5 mm.

12. The method of claim 1, wherein the durable tape of step (e) is sufficient to withstand thermal spray deposition temperatures for materials constituting the second coating.

13. The method of claim 12, wherein the durable tape comprises fiberglass.

14. The method of claim 1, wherein the durable tape of step (e) has a thickness in the range of about 100 microns (0.1 mm) to about 400 microns (0.4 mm).

15. The method of claim 14, wherein a single layer of the durable tape is used in step (e).

16. The method of claim 1, wherein the first coating of step (f) is a bond coat.

17. The method of claim 16, wherein the bond coat comprises an aluminide-based alloy or an alloy of the formula MCrAl(X), where M is an element selected from the group consisting of Ni, Co, Fe, and combinations thereof; and X is an element selected from the group consisting of Y, Ta, Si, Hf, Ti, Zr, B, C, and combinations thereof.

18. The method of claim 16, wherein the bond coat is applied by a thermal spray technique.

19. The method of claim 16, wherein the bond coat is applied by a method selected from the group consisting of plasma spray, sputtering, physical vapor deposition (PVD), vacuum plasma spray (VPS), high velocity oxy-fuel (HVOF), air plasma spray (APS), wire spray, and arc-wire spray.

20. The method of claim 16, wherein the second coating of step (h) is a ceramic overcoat.

21. The method of claim 20, wherein the ceramic overcoat is a zirconia-based thermal barrier coating.

22. The method of claim 21, wherein the thermal barrier coating is applied by a method selected from the group consisting of sputtering, physical vapor deposition (PVD), vacuum plasma spray (VPS), and air plasma spray (APS).

* * * * *

UNITED STATES PATENT AND TRADEMARK OFFICE
CERTIFICATE OF CORRECTION

PATENT NO. : 6,592,948 B1 Page 1 of 1
DATED : July 15, 2003
INVENTOR(S) : Fusaro Jr. et al.

It is certified that error appears in the above-identified patent and that said Letters Patent is hereby corrected as shown below:

<u>Column 1,</u>
Line 5, insert the following paragraph:
-- This invention was made with government support under Contract No. DE-FC21-95MC31176 awarded by the Department of Energy. The government may have certain rights to the invention. --

Signed and Sealed this

Eleventh Day of November, 2003

JAMES E. ROGAN
*Director of the United States Patent and Trademark Office*